US012777982B2

(12) United States Patent
Zhou et al.

(10) Patent No.: US 12,777,982 B2
(45) Date of Patent: Oct. 27, 2026

(54) SYSTEMS AND METHODS FOR CONNECTING INTEGRATED CIRCUITS

(71) Applicant: Avago Technologies International Sales Pte. Limited, Singapore (SG)

(72) Inventors: Ting Zhou, Orinda, CA (US); Jayanthi Pallinti, Los Gatos, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 373 days.

(21) Appl. No.: 18/498,644

(22) Filed: Oct. 31, 2023

(65) Prior Publication Data

US 2025/0029952 A1 Jan. 23, 2025

Related U.S. Application Data

(60) Provisional application No. 63/514,525, filed on Jul. 19, 2023.

(51) Int. Cl.
*H01L 23/00* (2006.01)
*H10B 80/00* (2023.01)
(Continued)

(52) U.S. Cl.
CPC ............ *H10W 90/00* (2026.01); *H10B 80/00* (2023.02); *H10W 70/65* (2026.01); (Continued)

(58) Field of Classification Search
CPC ....... G11C 5/025; G11C 5/06; H01L 2224/08; H01L 2224/08145; H01L 2224/09181; H01L 2224/13147; H01L 2224/16146; H01L 2224/16225; H01L 2224/73251; H01L 2224/80001; H01L 2224/80357; H01L 2224/80895; H01L 2224/80896; H01L 2225/06513; H01L 2225/06517; H01L 2225/06541; H01L 23/5381; H01L 23/5383; H01L 24/13; H01L 24/16; H01L 25/0652; H01L 25/0657; H01L 25/18; H01L 25/50; H01L 2924/00014; H01L 2924/1431; H01L 2924/1436; H10B 80/00
See application file for complete search history.

(56) References Cited

U.S. PATENT DOCUMENTS 10,615,110 B2 * 4/2020 Zhao ........................ H10P 72/74
11,367,707 B2 * 6/2022 Liff ........................ H10W 40/10
(Continued)

OTHER PUBLICATIONS

European Patent Office, Extended Search Report, Application No. 24189533.3, Jan. 13, 2025, 11 pages.

*Primary Examiner* — Jaehwan Oh
(74) *Attorney, Agent, or Firm* — Quarles & Brady LLP

(57) ABSTRACT

The subject technology is directed to integrated circuit technologies. In an embodiment, the subject technology provides a device that comprises a first circuit and a second circuit and a third circuit. The first circuit is coupled to the second circuit and the third circuit through a first interconnect. The third circuit is coupled to a fourth circuit through a second interconnect. The fourth circuit includes a processor circuit. The third circuit may support data transfer at a speed greater than what the second circuit could handle, facilitating the data transmission between the first circuit and the fourth circuit. There are other embodiments as well.

20 Claims, 3 Drawing Sheets

(51) Int. Cl.
*H10W 70/65* (2026.01)
*H10W 90/00* (2026.01)
*H10W 72/20* (2026.01)

(52) U.S. Cl.
CPC ........ *H10W 72/252* (2026.01); *H10W 90/722* (2026.01); *H10W 90/724* (2026.01)

(56) References Cited

U.S. PATENT DOCUMENTS

| | | | | |
|---|---|---|---|---|
| 12,166,011 | B1 * | 12/2024 | Dokania | G11C 11/401 |
| 2018/0308791 | A1 * | 10/2018 | Zhao | H10P 72/74 |
| 2020/0098724 | A1 * | 3/2020 | Liff | H10W 40/10 |
| 2023/0059491 | A1 * | 2/2023 | Dokania | G11C 11/401 |
| 2023/0110957 | A1 * | 4/2023 | Yang | H05K 1/145<br>361/783 |
| 2023/0116326 | A1 * | 4/2023 | Yang | H10W 20/20<br>257/774 |
| 2023/0163101 | A1 * | 5/2023 | Cheah | G11C 5/04<br>257/774 |
| 2023/0197705 | A1 * | 6/2023 | Rubin | H10W 90/00<br>257/668 |
| 2023/0343718 | A1 * | 10/2023 | Zhou | G11C 5/025 |
| 2024/0403240 | A1 * | 12/2024 | Ali | G06F 13/1673 |

* cited by examiner

SYSTEMS AND METHODS FOR CONNECTING INTEGRATED CIRCUITS

CROSS-REFERENCES TO RELATED APPLICATIONS

The present application claims priority to U.S. Provisional Patent Application 63/514,525, filed Jul. 19, 2023, entitled, "HBM INTERFACE PERFORMANCE, POWER CONSUMPTION AND LATENCY THROUGH 3D CHIPLET," which is commonly owned and incorporated by reference for all purposes.

FIELD OF INVENTION

The subject technology is directed to integrated circuits.

BACKGROUND OF THE INVENTION

In the field of semiconductor technology, the demand for faster and more efficient memory solutions has been ever-growing. High bandwidth memory (HBM) emerged as a revolutionary solution to address the bandwidth requirements of high-performance computing, graphics, and networking applications. HBM, a type of stacked dynamic random-access memory (DRAM), offers significantly higher bandwidth than traditional memory solutions, such as double data rate synchronous dynamic random-access memory (DDR SDRAM), while consuming less power. This is achieved by stacking memory dies vertically and connecting them using through-silicon vias (TSVs) and micro bumps.

Over the past, various approaches have been proposed for implementing HBM, but they have been inadequate. Improved methods and systems are desired.

DETAILED DESCRIPTION OF THE INVENTION

Figure 1:
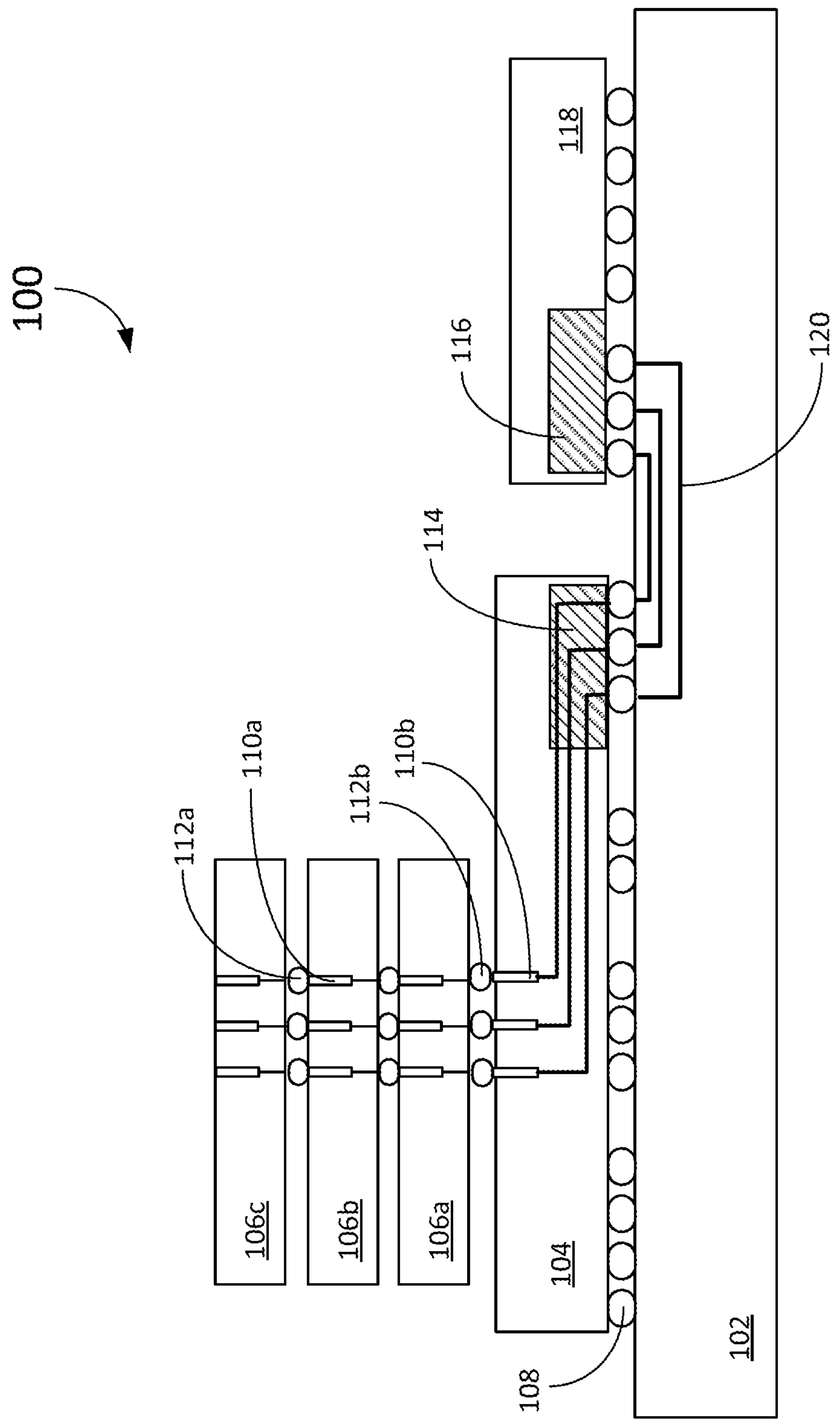
FIG. 1 is a simplified block diagram illustrating a system for connecting HBM to an integrated circuit device according to embodiments of the subject technology.

The subject technology is directed to integrated circuit technologies. In an embodiment, the subject technology provides a device that comprises a first circuit and a second circuit and a third circuit. The first circuit is coupled to the second circuit and the third circuit through a first interconnect. The third circuit is coupled to a fourth circuit through a second interconnect. The fourth circuit includes a processor circuit. The third circuit may support data transfer at a speed greater than what the second circuit could handle, facilitating the data transmission between the first circuit and the fourth circuit. There are other embodiments as well.

With the proliferation of applications demanding high-speed data processing, such as artificial intelligence, real-time graphics rendering, and advanced scientific simulations, the need to bridge the speed gap between HBM and logic boards has become paramount. There's a need for solutions that can optimize the interface between HBM and logic dies, ensuring that the system can harness the full potential of HBM without being bottlenecked by the logic board's limitations. For example, artificial intelligence (AI) algorithms, especially deep learning models, require vast amounts of data to be processed in real-time. This demands not only higher memory capacity but also faster memory access speeds, or bandwidth. Moreover, as AI finds applications in portable devices and edge computing, there's a need to reduce power consumption and minimize latency during memory access.

High bandwidth memory has emerged as a solution in addressing these memory challenges. HBM architecture, which involves stacking DRAM dies vertically, allows for a significant increase in bandwidth while reducing power consumption. For example, an HBM comprises DRAM die stacks that are 3D mounted atop a logic die using TSVs. The HBM physical layer (PHY), a critical component responsible for data transfer, is situated on the logic die. This PHY then connects to the functional or core die through a silicon interposer. However, as the technology has evolved (e.g., moving from its initial versions to HBM4), certain bottlenecks have become apparent, particularly in the HBM PHY.

As HBM technology advanced, offering greater speeds and capacities, a new challenge arose. The logic dies, which are responsible for processing and managing data, struggled to keep pace with the rapid data transfer rates offered by advanced HBM solutions. This disparity in speeds between the HBM and the HBM PHY on the logic dies led to potential bottlenecks, where the logic die became the limiting factor in the overall system performance. For example, silicon technology used for designing the HBM PHY on the logic dies might not be as advanced as that used for the HBM PHY on processor units. This can lead to limitations in the logic die's ability to handle the high speeds offered by HBM. For example, HBM or processor may be manufactured using 3 nm processes, while logic die may be manufactured using 14 nm processes. Upgrading the logic die to match the speed of advanced HBM solutions can be costly. It also introduces design complexities, especially when trying to maintain compatibility with existing systems. Increasing the speed of logic dies to match HBM might lead to significant cost increases, making it the primary concern for manufacturers. Among other things, the choice of silicon technology for the logic die is not straightforward. It's a complex decision influenced by multiple factors. Advanced silicon technologies, while offering better performance, are often more expensive. This makes cost a significant factor in the decision-making process. Different components within the chip have varying performance requirements. The chosen technology must cater to the needs of all these components without compromising on overall chip performance. Especially relevant for portable devices, the silicon technology must ensure that power consumption is optimized. Often, a more mature (and sometimes slower) silicon technology might be preferred due to its proven reliability, even if it's not the latest available.

It is to be appreciated that embodiments of the subject technology provide an intermediary chip (e.g., may be referred to as a droplet chip or a droplet circuit) that connects HBM and processing units, and bypasses the data rate bottleneck presented by the logic die. As explained above, logic dies in some approaches, while versatile, might not be optimized for the high-speed data transfers that advanced HBM solutions offer. Droplet chip can handle high-speed transfers efficiently, bypassing the limitations of the logic chip. For example, droplet chip may act as a high-speed conduit, ensuring that data from the HBM is fed to the processing units at the optimal rate, minimizing latency and maximizing bandwidth utilization. It is to be appreciated that by streamlining data transfers and reducing the need for multiple data conversions or buffering, droplet chip can contribute to overall power savings, useful for portable and edge devices. Depending on the implementation, droplet chips can be tailored to specific use cases or applications, allowing for a modular approach where different droplet chips can be used based on the specific requirements of the system. By taking over the function of managing high-speed data transfers, droplet chip can reduce the design complexity of the logic dies, allowing it to be optimized for other tasks.

The use of droplet chip, according to embodiments of the subject technology, can improve how systems are designed and integrated. Instead of trying to force the logic chip to handle tasks it might not be optimized for, droplet chip can help manage (e.g., with drivers and gearbox) the high-speed data transfers, ensuring that both the HBM and the processing units operate at their peak potential. For example, droplet chip acts as a specialized bridge, ensuring that the vast data capacities of HBM are seamlessly and efficiently fed into the processing units, allowing for systems that are faster, more power-efficient, and optimized for the demands of modern applications.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the subject technology is not intended to be limited to the embodiments presented, but is to be accorded the widest scope consistent with the principles and novel features disclosed herein.

In the following detailed description, numerous specific details are set forth in order to provide a more thorough understanding of the subject technology. However, it will be apparent to one skilled in the art that the subject technology may be practiced without necessarily being limited to these specific details. In other instances, well-known structures and devices are shown in block diagram form, rather than in detail, in order to avoid obscuring the subject technology.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

When an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

When an element is referred to herein as being "disposed" in some manner relative to another element (e.g., disposed on, disposed between, disposed under, disposed adjacent to, or disposed in some other relative manner), it is to be understood that the elements can be directly disposed relative to the other element (e.g., disposed directly on another element), or have intervening elements present between the elements. In contrast, when an element is referred to as being "disposed directly" relative to another element, it should be understood that no intervening elements are present in the "direct" example. However, the existence of a direct disposition does not exclude other examples in which intervening elements may be present.

Similarly, when an element is referred to herein as being "bonded" to another element, it is to be understood that the elements can be directly bonded to the other element (without any intervening elements) or have intervening elements present between the bonded elements. In contrast, when an element is referred to as being "directly bonded" to another element, it should be understood that no intervening elements are present in the "direct" bond between the elements. However, the existence of direct bonding does not exclude other forms of bonding, in which intervening elements may be present.

Likewise, when an element is referred to herein as being a "layer," it is to be understood that the layer can be a single layer or include multiple layers. For example, a conductive layer may comprise multiple different conductive materials or multiple layers of different conductive materials, and a dielectric layer may comprise multiple dielectric materials or multiple layers of dielectric materials. When a layer is described as being coupled or connected to another layer, it is to be understood that the coupled or connected layers may include intervening elements present between the coupled or connected layers. In contrast, when a layer is referred to as being "directly" connected or coupled to another layer, it should be understood that no intervening elements are present between the layers. However, the existence of directly coupled or connected layers does not exclude other connections in which intervening elements may be present.

Moreover, the terms left, right, front, back, top, bottom, forward, reverse, clockwise and counterclockwise are used for purposes of explanation only and are not limited to any fixed direction or orientation. Rather, they are used merely to indicate relative locations and/or directions between various parts of an object and/or components.

Furthermore, the methods and processes described herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth should be understood as being modified in all instances by the term "about." In this application, the use of the singular includes the plural unless specifically stated otherwise, and use of the terms "and" and "or" means "and/or" unless otherwise indicated. Moreover, the use of the terms "including" and "having," as well as other forms, such as "includes,"

"included," "has," "have," and "had," should be considered non-exclusive. Also, terms such as "element" or "component" encompass both elements and components comprising one unit and elements and components that comprise more than one unit, unless specifically stated otherwise.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items. By way of example, the phrases "at least one of A, B, and C" or "at least one of A, B, or C" each refer to only A, only B, or only C; and/or any combination of A, B, and C. In instances where it is intended that a selection be of "at least one of each of A, B, and C," or alternatively, "at least one of A, at least one of B, and at least one of C," it is expressly described as such.

One general aspect includes a device, which comprises a first circuit comprising a first side, the first side comprising a first region and a second region, the first circuit comprising a first interconnect. The device further comprises a second circuit coupled to the first region, the second circuit being coupled to the first circuit through the first interconnect. The device further comprises a third circuit coupled to the second region, the third circuit being coupled to the first circuit through the first interconnect. The device further comprises a second interconnect coupled to the third circuit. The device further comprises a fourth circuit coupled to the third circuit through the second interconnect.

Implementations may include one or more of the following features. The device further comprises a first memory coupled to the second circuit, the second circuit comprising a second memory. The first memory circuit comprises a first through silicon via (TSV) and the second memory circuit comprises a second TSV, the first TSV being coupled to the second TSV through a micro bump. The third circuit comprises a driver. The device further comprises an interposer comprising the second interconnect. The fourth circuit comprises a processor. The first circuit is coupled to the second circuit by hybrid copper bonding. The first circuit is coupled to the third circuit by hybrid copper bonding. The third circuit comprises a first physical layer circuit. The fourth circuit comprises a second physical layer circuit, the first physical layer circuit is coupled to the second physical layer circuit through the second interconnect. The first side comprises a metal layer; and the first circuit further comprises a second side, the second side comprises a silicon layer. The first interconnect comprises a bus operating at a first speed and the first circuit comprises a logic circuit operating at a second speed, the first speed being higher than the second speed. The third circuit comprises a gearbox circuit; the fourth circuit operates at a third speed; and the gearbox circuit is configured to match the first speed to the third speed. The device further comprises a die coupled to the third circuit.

According to another embodiment, the subject technology provides a device, which comprises a first circuit comprising a first side and a second side, the first side comprising a first region and a second region, the first circuit comprising a first interconnect. The device further comprises a second circuit coupled to the first region, the second circuit being coupled to the first circuit through the first interconnect. The device further comprises a third circuit coupled to the second region, the third circuit being coupled to the first circuit through the first interconnect. The device further comprises an interposer coupled to the second side. The device further comprises a fourth circuit coupled to the third circuit through the interposer.

Implementations may include one or more of the following features. The first side comprises a metal layer, and the second side comprises a silicon layer. The third circuit comprises a first physical layer circuit, the fourth circuit comprises a second physical layer circuit, and the first physical layer circuit is coupled to the second physical layer circuit through the interposer. The first circuit is coupled to the second circuit by hybrid copper bonding.

According to yet another embodiment, the subject technology provides a device, which comprises a first circuit comprising a first side, the first side comprising a first region and a second region, the first circuit comprising a first interconnect. The first side comprises a second circuit coupled to the first region, the second circuit being coupled to the first circuit through the first interconnect. The first side comprises a third circuit coupled to the second region, the third circuit comprising a first physical layer circuit. The first side comprises a second interconnect coupled to the third circuit. The first side comprises a fourth circuit comprising a second physical layer circuit, the second physical layer circuit being coupled to the first physical layer circuit through the second interconnect. In some embodiments, the first interconnect comprises a bus operating at a first speed and the first circuit comprises a logic circuit operating at a second speed, the first speed being higher than the second speed.

FIG. 1 is a simplified block diagram illustrating a system 100 for connecting HBM to an integrated circuit device according to embodiments of the subject technology. This diagram merely provides an example, which should not unduly limit the scope of the claims. One of ordinary skill in the art would recognize many variations, alternatives, and modifications.

As shown, system 100 includes interposer 102. For example, the term "interposer" refers to an electrical interface that redirects electrical connections between electrical components, which can spread a connection to a wider pitch or reroute a connection to a different connection. For instance, interposer 102 may include a substrate that facilitates electrical connections among various components (e.g., a processor circuit and a memory circuit) using one or more interconnects, allowing for high-speed data transfer and compact semiconductor integration.

As an example, circuit 118 is coupled to interposer 102 and may be coupled to other components through interposer 102. Circuit 118 may include a processor circuit. The term "processor circuit" may refer to an integrated circuit that contains the logic and arithmetic units that perform the operations and calculations required by a computer program. For instance, circuit 118 may include, without limitation, an application-specific integrated circuit (ASIC), a central processing unit (CPU), a graphics processing unit (GPU), system-on-chip (SoC), memory interfaces, memory controllers, input/output devices, input/output interfaces, secondary storage interfaces, and/or the like. Depending on the application, circuit 118 may be configured to perform computing-intensive tasks and require high-speed data transmission from the memory device. For example, circuit 118 may include an AI accelerator that runs complex machine-learning algorithms on large amounts of data. Circuit 118 may need to access the memory device frequently to read and write data, such as weights, activations, gradients, etc. In some cases, circuit 118 may need to communicate with other components, such as sensors, cameras, displays, etc., to receive inputs and outputs.

In various examples, circuit 104 is coupled to interposer 102 via interconnect 108. The term "interconnect" may refer to may refer to an electrical structure that establishes electrical pathways between different components or sections of the semiconductor device, allowing for data, signal, and/or power transmission. For example, interconnect 108 may include, without limitation, metal traces, vias, micro bumps, conductive pads, and/or other conductive materials and structures.

In some embodiments, circuit 104 is coupled to circuit 106*a*. For example, circuit 106*a* includes a first memory circuit. The term "memory circuit" may refer to an electronic chip or integrated circuit configured to store, retain, and facilitate retrieval of data. For instance, circuit 106*a* may include, without limitation, high-bandwidth memory (HBM), Dynamic random-access memory (DRAM), static random-access memory (SRAM), flash memory, phase-change memory (PCM), magnetoresistive random-access memory (MRAM), electrically erasable programmable read-only memory (EEPROM), and/or the like. As an example, circuit 106*a* includes a high-bandwidth memory (HBM). The term "high-bandwidth memory" or "HBM" may refer to a high-speed random-access memory interface designed for use in high-performance applications, such as graphics cards, high-performance computing, machine learning, and/or the like.

Depending on the implementation, one or more memory circuits may be stacked together to form a 3D package that offers higher memory capacity, bandwidth, and performance than a single memory circuit. For instance, circuit 106*a* may be stacked with one or more circuits (e.g., circuit 106*b* and/or circuit 106*c*, etc.), which may be memory circuits of the same or different types. Such a stacked memory configuration can reduce the power consumption, size, and cost of the memory system. In some examples, the stacked memory circuits (e.g., circuits 106*a*, 106*b*, 106*c*, etc.) may be connected using through-silicon via (TSV) 110*a* and/or micro bump 112*a*, which may establish vertical electrical connections that pass through the circuit, allowing for faster and more efficient data transfer between the memory circuits. The term "through-silicon via" or "TSV" may refer to an electrical connection that passes through a silicon wafer or die. TSVs are used to connect multiple chips or layers in a 3D package, providing high-density, low-latency, and low-power interconnections between the circuits or layers. The term "micro bump" may refer to a bonding medium that supports power and signaling between the chips or layers in a 3D package, such as HBM and logic circuits. A micro bump may be a metal bump that has a very small diameter (e.g., less than 25 μm) and pitch (e.g., less than 40 μm). Micro bumps may include, without limitation, one or more materials such as copper, gold, solder, nickel, and/or the like.

In various implementations, circuit 104 may include a logic circuit. Circuit 104 may be coupled to one or more memory circuits (e.g., circuits 106*a*, 106*b*, 106*c*, etc.) through TSV 110*b* and/or micro bump 112*b*. For example, the term "memory circuit" or "memory" refers to a device or system that can store and retrieve data using electrical or optical signals, including HBM. The term "logic circuit" may refer to a chip or circuit that is responsible for managing the data transfer, error correction, power distribution, or other functions of one or more memory circuits (e.g., circuit 106*a*). For instance, circuit 104 may be configured to connect and control the data transmission between one or more memory circuits (e.g., circuit 106*a*) and a functional die (e.g., circuit 118) in a high-performance system. It acts as a bridge between the memory circuits and the functional die, ensuring that they can communicate and exchange data efficiently and reliably. Depending on the implementation, circuit 104 can be customized for different applications and requirements, such as graphics, artificial intelligence, high-performance computing, data centers, and/or networking. Circuit 104 may be designed using different silicon technologies and processes, depending on the performance, power, cost, and reliability trade-offs.

In some embodiments, circuit 104 includes a physical layer (PHY) circuit 114. The term "physical layer" or "physical layer circuit" may refer to a segment of a semiconductor chip that handles the physical and data link layer connectivity and can provide electrical and logical interfaces between a memory circuit (e.g., circuit 106*a*) and a functional die (e.g., circuit 118). PHY circuit 114 may include various components for facilitating data transfer, such as input/output terminals, phase-locked loop (PLL), transmitter, receiver, and/or the like. Depending on the application, PHY circuit 114 may be optimized to support various features and standards of HBM, such as data rate, bandwidth, error correction, refresh modes, and/or the like.

In various implementations, circuit 118 includes a PHY circuit 116. PHY circuit 114 may be coupled to PHY circuit 116 through interconnect 120 of interposer 102. PHY circuits 114 and 116 may be configured to facilitate high-speed data transfer between circuit 106*a* and circuit 118. However, the advancement of HBM's high-speed data transfer capabilities has outpaced the processing and managing capacities of logic circuits, resulting in potential bottlenecks that limit the overall system performance. In other words, while HBM may promise a high data transfer rate (e.g., greater than 2 Gbps per pin) and high bandwidth (e.g., greater than 400 Gbytes/s), the logic circuit struggles to efficiently handle and utilize this rapid flow of data, leading to inefficiencies and underutilization of HBM's potential. Therefore, there is a need to bridge this gap to effectively leverage the full potential of HBM's data transfer and bandwidth capabilities.

Figure 2:
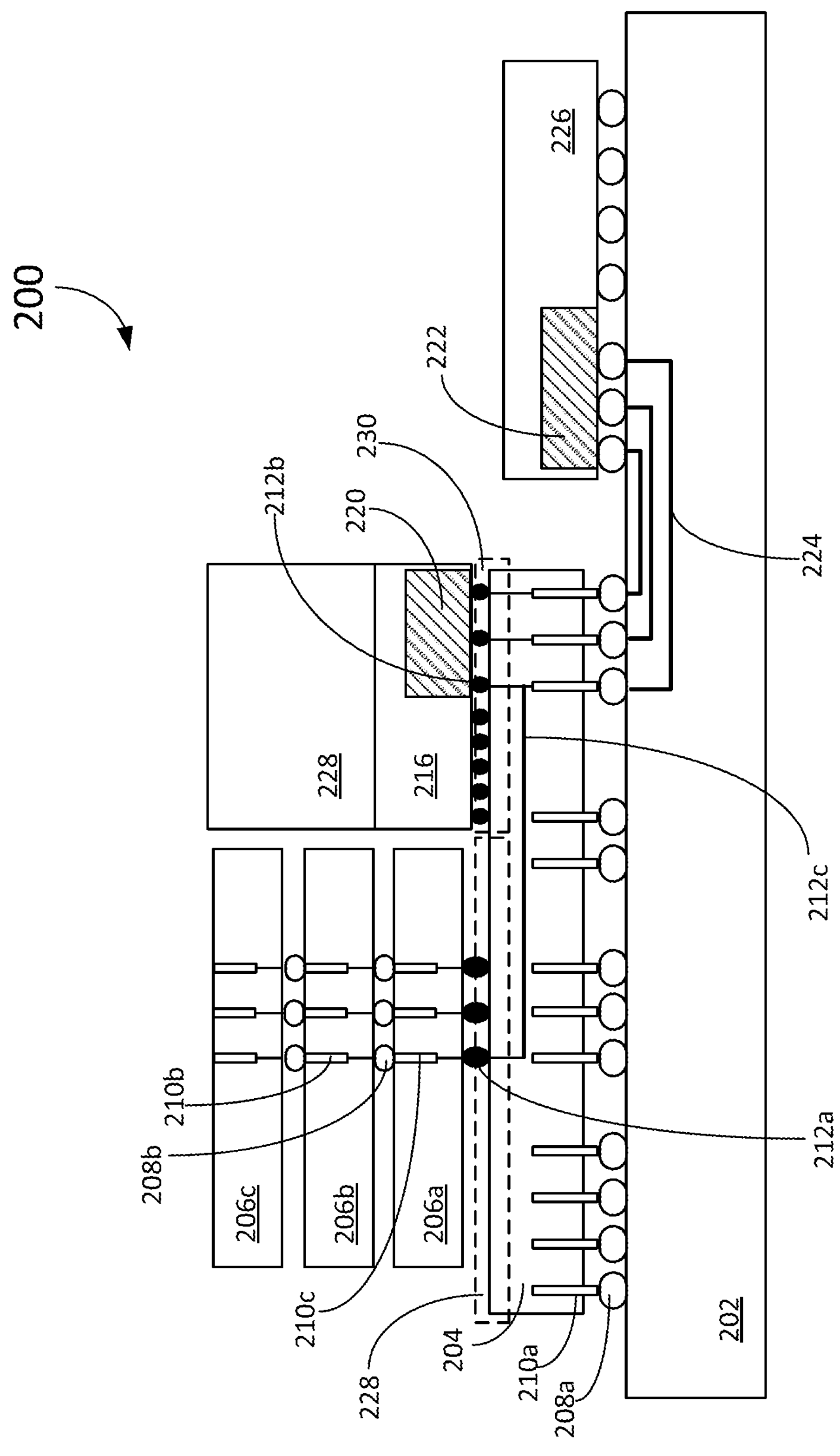
FIG. 2 is a simplified block diagram illustrating a system for connecting HBM to an integrated circuit device using a droplet circuit according to embodiments of the subject technology.

FIG. 2 is a simplified block diagram illustrating a system 200 for connecting HBM to an integrated circuit device using a droplet circuit according to embodiments of the subject technology. This diagram merely provides an example, which should not unduly limit the scope of the claims. One of ordinary skill in the art would recognize many variations, alternatives, and modifications. As shown, system 200 may include interposer 202, which serves as a substrate that facilitates electrical connections among various components using one or more interconnects, providing efficient pathways for signal transmission, reduced latency, and enhanced system integration. For example, circuit 204 (e.g., a first circuit recited in claim 1) is coupled to interposer 202 through TSV 210*a* and/or micro bump 208*a*.

In various implementations, circuit 204 includes a first side and a second side. For instance, the first side may include a front side or top portion of circuit 204 and the second side may include a bottom side or back portion of circuit 204. In some cases, the first side may include a metal layer and the second side may include a silicon layer. The first side may include first region 228 and second region 230.

In some examples, system 200 further includes circuit 206*a* (e.g., a second circuit recited in claim 1). Circuit 206*a* may be coupled to circuit 204 through a first interconnect (e.g., a first interconnect recited in claim 1). For instance, circuit 206*a* includes a memory circuit. Circuit 206*a* may include, without limitation, high-bandwidth memory (HBM), Dynamic random-access memory (DRAM), static random-access memory (SRAM), flash memory, phase-change memory (PCM), magnetoresistive random-access memory (MRAM), electrically erasable programmable read-only memory (EEPROM), and/or the like. In an example, circuit 206*a* includes an HBM, which may be used in high-performance applications, such as graphics cards, high-performance computing, machine learning, and/or the like. Depending on the implementation, circuit 206*a* may be characterized by a data transfer rate greater than 2 Gbps per pin.

In some embodiments, one or more memory circuits may be stacked together to form a 3D package that offers higher memory capacity, bandwidth, and performance than a single memory circuit. For instance, circuit 206*a* may be stacked with one or more circuits (e.g., circuit 206*b* and/or circuit 206*c*, etc.), which may be memory circuits of the same or different types. In various examples, the stacked memory circuits (e.g., circuits 206*a*, 206*b*, 206*c*, etc.) may be connected using through-silicon via (TSV) 210*b* and/or micro bump 208*b*, which may establish vertical electrical connections that pass through the circuit, allowing for faster and more efficient data transfer between the memory circuits. For instance, stacked memory circuits may be characterized by a bandwidth of greater than 400 Gbytes/s. In some examples, circuit 206*a* includes a TSV 210*c* and circuit 206*b* includes a TSV210*b*. TSV 210*c* may be coupled to TSV210*b* through micro bump 208*b*.

In various implementations, circuit 204 includes a logic circuit, which may be configured to manage, process, and communicate with one or more memory circuits (e.g., circuits 206*a*, 206*b*, 206*c*, etc.). For instance, circuit 206*a* is coupled to circuit 204 (e.g., first region 228) through the first interconnect. Depending on the implementation, the first interconnect may include, without limitation, metal traces, vias, micro bumps, conductive pads, and/or other conductive materials and structures. For example, the first interconnect includes hybrid copper bonding (HCB) 212*a*. The term "hybrid copper bonding" or "hybrid copper bonding pads" may include bonding between copper or other metals (e.g., gold, etc.) and dielectric materials, which can be organic (e.g., small molecules or monomers, etc.) or inorganic (e.g., silicon oxide, other metal oxides, etc.). HCB offers a robust and compact bonding solution, enhancing electrical conductivity and mechanical strength between the logic circuit and memory circuits, while also optimizing thermal performance and potentially reducing manufacturing costs. In order to facilitate HCB bonding, circuit 204 may be oriented such that its metal layer faces upward (e.g., towards circuit 206*a*). This orientation ensures direct contact between the metal layers of both circuits, facilitating efficient HCB bonding and optimizing electrical connectivity between the two.

According to some embodiments, system 200 further includes circuit 216 (e.g., a third circuit recited in claim 1). For instance, circuit 216 is coupled to circuit 204 (e.g., second region 230) through the first interconnect, which may include HCB 212*b*. In various implementations, circuit 216 may include PHY circuit 220. PHY circuit 220 may serve as an interface between a memory circuit (e.g., circuit 206*a*) and a functional die (e.g., circuit 226) and is configured to perform various functions to facilitate the data transmission between the two. For instance, PHY circuit 220 may be responsible for sending and receiving data, commands, and/or control signals between the memory circuit and the functional die. PHY circuit 220 may be configured to handle tasks such as data serialization and deserialization, link training and calibration, error detection and correction, and/or the like. PHY circuit 220 may include various components for facilitating data transfer, such as input/output terminals, phase-locked loop (PLL), transmitter, receiver, and/or the like. Depending on the application, PHY circuit 220 may be optimized to support various features and standards of HBM, such as data rate, bandwidth, error correction, refresh modes, and/or the like.

In various implementations, circuit 206*a* may be coupled to PHY circuit 220 through the first interconnect. For instance, the first interconnect further includes bus 212*c*, which may be positioned inside circuit 204. During operation, a data signal from circuit 206*a* may be sent through one or more TSVs and micro bumps (e.g., TSVs 210*b* and 210*c*, micro bump 208*b*, etc.) to a corresponding HCB (e.g., HCB 212*a*) on circuit 204. The HCBs may be connected by bus 212*c*, which runs along circuit 204. Bus 212*c* transfers the data from one or more HCBs to PHY 220 through one or more TSVs and/or HCB 212*b*. PHY circuit 220 may then perform various functions to facilitate the data transmission between the memory stacks and a functional die (e.g., circuit 226).

In some cases, bus 212*c* is configured to operate at a first speed, and circuit 204 is configured to operate at a second speed. The first speed may be higher than the second speed. For instance, the first speed may be greater than 2 Gbps per pin, allowing for high bandwidth and throughput for the data transfer between the memory stack and the PHY circuit. The second speed may be lower than the first speed, enabling the logic circuit to dedicate resources to other functions such as memory management, power management, or the like. By separating the data transmission role from the logic circuit, the system can reduce power consumption and heat generation, leading to enhanced efficiency and reliability.

As previously noted, the overall system performance has been met with bottlenecks when interfacing with logic circuits (e.g., circuit 204). The inherent limitations of the logic circuit in processing and managing the speedy data flows have often resulted in underutilization of the full potential that memory circuits (e.g., HBM) can offer. By decoupling the PHY circuit (e.g., PHY circuit 220) from the logic circuit and incorporating it into a separate circuit (e.g., circuit 216), system 200 provides a dedicated and optimized interface tailored to the demands of rapid data transfers. This ensures more efficient communication between the memory and functional dies, allowing each component to function at its peak potential. Such strategic separation not only eliminates the data transfer constraints on the logic circuit but also empowers it to focus more efficiently on its core tasks such as data computation, management, buffering, testing, or other system-level functions. Depending on the implementation, circuit 216 may be coupled to die 228 to match a height of the memory stack (e.g., one or more circuits 206*a*, 206*b*, 206*c*, etc.).

In some embodiments, system 200 further includes circuit 226 (e.g., a fourth circuit recited in claim 1), which may include a processor circuit. For instance, circuit 226 may include, without limitation, an application-specific integrated circuit (ASIC), a central processing unit (CPU), a graphics processing unit (GPU), system-on-chip (SoC), memory interfaces, memory controllers, input/output devices, input/output interfaces, secondary storage interfaces, and/or the like. Depending on the application, circuit 226 may be configured to perform computing-intensive tasks and require high-speed data transmission from the memory device. For example, circuit 226 may include an AI accelerator that runs complex machine-learning algorithms on large amounts of data. Circuit 226 may need to access the memory device frequently to read and write data, such as weights, activations, gradients, etc.

In various implementations, circuit 226 includes a PHY circuit 222. PHY circuit 222 may be coupled to PHY circuit 220 through interconnect 224. Depending on the application, PHY circuits can be optimized to support different modes and speeds of data transmission. For instance, PHY circuits 220 and 222 may support a data transfer rate greater than 2 Gbps per pin, which provides high bandwidth and throughput for data-intensive applications such as real-time graphics rendering or machine learning computations. The integration of PHY circuits 220 and 222 within system 200 facilitates seamless and rapid data exchange between essential components. Their ability to support high-speed data transmission caters to the demands of data-centric applications, ensuring optimal performance and efficiency in various operational scenarios. In some cases, circuit 226 is configured to operate at a third speed. Circuit 226 is configured to match the first speed of bus 212*c* to the third speed of circuit 226 to ensure a seamless and rapid data flow for various applications.

Figure 3:
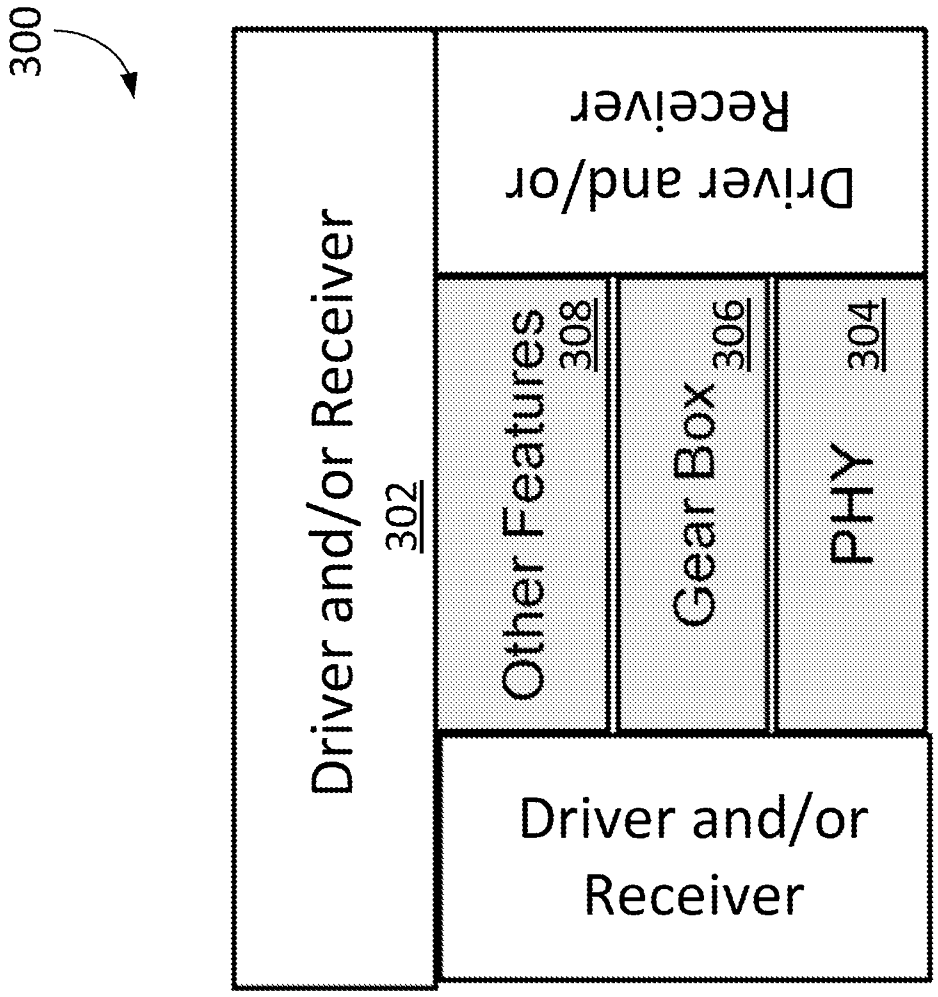
FIG. 3 is a simplified block diagram illustrating a droplet circuit according to embodiments of the subject technology.

FIG. 3 is a simplified block diagram illustrating a droplet circuit 300 according to embodiments of the subject technology. This diagram merely provides an example, which should not unduly limit the scope of the claims. One of ordinary skill in the art would recognize many variations, alternatives, and modifications. In various implementations, circuit 300 may implemented as an intermediary chip (e.g., circuit 216 of FIG. 2) configured to connect memory circuits and functional dies within a semiconductor package. This intermediary configuration ensures optimal communication pathways, reduced latency, and the ability to harness the full potential of both memory and processing resources.

As shown, circuit 300 may include circuit 302. For instance, circuit 302 may include a driver circuit and/or a receiver circuit. The term "driver circuit" may refer to a circuit or component that converts and amplifies an electrical signal from one circuit to another. The term "receiver circuit" may refer to a circuit or component that receives and restores an electrical signal from another circuit. For instance, the driver and receiver circuits may be used to facilitate data transfer among various components of the semiconductor device. As an example, the driver and receiver circuit can facilitate data transfer between one or more memory circuits (e.g., circuits 206*a*, 206*b*, 206*c* of FIG. 2) and a functional die (e.g., circuit 226 of FIG. 2). In some cases, circuit 302 (e.g., driver and/or receiver circuits) may communicate with the one or more memory circuits (e.g., circuits 206*a*, 206*b*, 206*c* of FIG. 2) through a logic circuit (e.g., circuit 204 of FIG. 2). The driver circuit may amplify and transmit high-speed data signals from the functional die to the memory circuit; the receiver circuit may receive data signals from a high-speed data bus and convert them to a form that can be processed by the functional die. In some cases, circuit 302 may be coupled to a logic circuit (e.g., circuit 204 of FIG. 2) through one or more interconnects.

In various implementations, circuit 300 further includes a gearbox circuit 306. The term "gearbox" or "gearbox circuit" may refer to a circuit or component configured to modulate the data rate and format of signals being transmitted between different circuits. For instance, gearbox circuit 306 is configured to convert a high-speed data stream from the memory circuit (e.g., HBM) into a format or rate that the functional die can seamlessly handle or vice versa. For instance, a memory circuit (e.g., circuit 206*a* and/or bus 212*c* of FIG. 2) may operate at a first speed, and a PHY circuit 304 may operate at a second speed. Gearbox circuit 306 may be configured to match the first speed to the second speed. By facilitating rate matching and format conversion, gearbox circuit 306 effectively bridges the potential disparities in data transfer speeds between memory circuits and various functional dies, ensuring smooth and efficient data flow. Depending on the application, gearbox circuit 306 may perform various functions such as data alignment, synchronization, and/or the like.

In some embodiments, circuit 300 includes a PHY circuit 304. As previously noted, PHY circuit 304 may serve as an interface between a memory circuit (e.g., circuit 206*a* of FIG. 2) and a functional die (e.g., circuit 226 of FIG. 2) and is configured to perform various functions to facilitate the data transmission between the two. For instance, PHY circuit 304 may be responsible for sending and receiving data, commands, and/or control signals between the memory circuit and the functional die. PHY circuit 304 may be configured to handle tasks such as data serialization and deserialization, link training and calibration, error detection and correction, and/or the like. PHY circuit 304 may include various components for facilitating data transfer, such as input/output terminals, phase-locked loop (PLL), transmitter, receiver, and/or the like. Depending on the application, PHY circuit 304 may be optimized to support various features and standards of HBM, such as data rate, bandwidth, error correction, refresh modes, and/or the like. Depending on the implementation, circuit 300 may further include one or more features 308 such as power management, thermal management, clock generation, testability, security, and/or the like.

While the above is a full description of the specific embodiments, various modifications, alternative constructions and equivalents may be used. Therefore, the above description and illustrations should not be taken as limiting the scope of the subject technology which is defined by the appended claims.

What is claimed is:

1. A device comprising:

a first circuit comprising a first side, the first side comprising a first region and a second region, the first circuit comprising a first interconnect, the first interconnect comprising a first hybrid copper bonding and a second hybrid copper bonding, the first hybrid copper bonding being coupled to a through-silicon via by a bus;

a second circuit coupled to the first region, the second circuit being coupled to the first circuit through the first interconnect;

a third circuit coupled to the second region, the third circuit being coupled to the first circuit through the first interconnect, the third circuit being connected to the through-silicon via through the second hybrid copper bonding;

a second interconnect coupled to the third circuit; and a fourth circuit coupled to the third circuit through the second interconnect.

2. The device of claim 1, further comprising a first memory coupled to the second circuit, the second circuit comprising a second memory.

3. The device of claim 2, wherein the first memory circuit comprises a first through silicon via (TSV) and the second memory circuit comprises a second TSV, the first TSV being coupled to the second TSV through a micro bump.

4. The device of claim 1, wherein the third circuit comprises a driver.

5. The device of claim 1, further comprising an interposer comprising the second interconnect.

6. The device of claim 1, wherein the fourth circuit comprises a processor.

7. The device of claim 1, wherein the first circuit is coupled to the second circuit by the hybrid copper bonding.

8. The device of claim 1, wherein the first circuit is coupled to the third circuit by the hybrid copper bonding.

9. The device of claim 1, wherein the third circuit comprises a first physical layer circuit.

10. The device of claim 9, wherein the fourth circuit comprises a second physical layer circuit, the first physical layer circuit is coupled to the second physical layer circuit through the second interconnect.

11. The device of claim 1, wherein:

the first side comprises a metal layer; and the first circuit further comprises a second side, the second side comprises a silicon layer.

12. The device of claim 1, wherein the first interconnect comprises a bus operating at a first speed and the first circuit comprises a logic circuit operating at a second speed, the first speed being higher than the second speed.

13. The device of claim 12, wherein:

the third circuit comprises a gearbox circuit;

the fourth circuit operates at a third speed; and the gearbox circuit is configured to match the first speed to the third speed.

14. The device of claim 1, further comprising a die coupled to the third circuit.

15. A device comprising:

a first circuit comprising a first side and a second side, the first side comprising a first region and a second region, the first circuit comprising a first interconnect, the first interconnect comprising a first hybrid copper bonding and a second hybrid copper bond, the first hybrid copper bonding being coupled to a through-silicon via by a bus;

a second circuit coupled to the first region, the second circuit being coupled to the first circuit through the first interconnect;

a third circuit coupled to the second region, the third circuit being coupled to the first circuit through the first interconnect, the third circuit being connected to the through-silicon via through the second hybrid copper bonding;

an interposer coupled to the second side; and a fourth circuit coupled to the third circuit through the interposer.

16. The device of claim 15, wherein the first side comprises a metal layer, and the second side comprises a silicon layer.

17. The device of claim 15, wherein the third circuit comprises a first physical layer circuit, the fourth circuit comprises a second physical layer circuit, and the first physical layer circuit is coupled to the second physical layer circuit through the interposer.

18. The device of claim 15, wherein the first circuit is coupled to the second circuit by hybrid copper bonding.

19. A device comprising:

a first circuit comprising a first side, the first side comprising a first region and a second region, the first circuit comprising a first interconnect, the first interconnect comprising a first hybrid copper bonding and a second hybrid copper bonding, the first hybrid copper bonding being coupled to a through-silicon via by a bus;

a second circuit coupled to the first region, the second circuit being coupled to the first circuit through the first interconnect;

a third circuit coupled to the second region, the third circuit comprising a first physical layer circuit, the third circuit being connected to the through-silicon via through the second hybrid copper bonding;

a second interconnect coupled to the third circuit; and a fourth circuit comprising a second physical layer circuit, the second physical layer circuit being coupled to the first physical layer circuit through the second interconnect.

20. The device of claim 19, wherein the first interconnect comprises a bus operating at a first speed and the first circuit comprises a logic circuit operating at a second speed, the first speed being higher than the second speed.

* * * * *